(12) United States Patent
Besse et al.

(10) Patent No.: US 9,099,306 B2
(45) Date of Patent: Aug. 4, 2015

(54) INTEGRATED CIRCUIT DEVICE AND A METHOD FOR PROVIDING ESD PROTECTION

(75) Inventors: Patrice Besse, Tournefeuille (FR); Philippe Givelin, Leguevin (FR); Eric Rolland, Grepiac (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/372,624

(22) PCT Filed: Jan. 20, 2012

(86) PCT No.: PCT/IB2012/000247
§ 371 (c)(1),
(2), (4) Date: Jul. 16, 2014

(87) PCT Pub. No.: WO2013/108065
PCT Pub. Date: Jul. 25, 2013

(65) Prior Publication Data
US 2015/0076556 A1  Mar. 19, 2015

(51) Int. Cl.
H01L 23/62 (2006.01)
H01L 27/02 (2006.01)
H01L 27/06 (2006.01)
H01L 29/74 (2006.01)

(52) U.S. Cl.
CPC ........ *H01L 27/0248* (2013.01); *H01L 27/0255* (2013.01); *H01L 27/0259* (2013.01); *H01L 27/0647* (2013.01); *H01L 29/7412* (2013.01); *H01L 29/7428* (2013.01)

(58) Field of Classification Search
CPC ............ H01L 27/0259; H01L 27/0251; H01L 27/0255; H01L 27/0248; H01L 27/0647; H01L 29/7428; H01L 27/0262

USPC .................................... 257/355, 362; 361/56
See application file for complete search history.

(56) References Cited

U.S. PATENT DOCUMENTS 5,568,345 A * 10/1996 Mudd et al. .................... 361/56
6,426,855 B2    7/2002 Lee et al.
7,548,401 B2    6/2009 Mergens et al.
(Continued)

OTHER PUBLICATIONS

Torres Cynthia A. et al: "Modular, Portable, and Easily Simulated ESD Protection Networks for Advanced CMOS Technologies", IEEE, Electrical Overstress/Electrostatic Discharge Symposium, 2001. EOS/ESD '01, Portland, OR, Sep. 11-13, 2001, pp. 81-94.

(Continued)

*Primary Examiner* — Minh-Loan Tran

(57) ABSTRACT

An integrated circuit (IC) device including an electrostatic discharge (ESD) protection network for a high voltage application. The ESD protection network includes a common diode structure coupled between an external contact of the IC device and a substrate of the IC device, such that the common diode structure is forward biased towards the external contact, a Darlington transistor structure coupled between the external contact and the substrate of the IC device, and the Darlington transistor structure includes: an emitter node coupled to the external contact; a collector node coupled to the substrate; and a base node coupled between the emitter node of the Darlington transistor structure and the common diode structure. The at least one ESD protection network further comprises an isolation diode structure coupled between the emitter node and the base node of the Darlington transistor structure such that the isolation diode structure is forward biased towards the base node.

9 Claims, 3 Drawing Sheets

(56) References Cited

U.S. PATENT DOCUMENTS

| | | |
|---|---|---|
| 7,773,355 B2 | 8/2010 | Ma et al. |
| 2007/0058307 A1* | 3/2007 | Mergens et al. ............... 361/56 |
| 2007/0297106 A1 | 12/2007 | Dai et al. |
| 2013/0114173 A1* | 5/2013 | Chen et al. .................... 361/56 |

OTHER PUBLICATIONS

International Search Report and Written Opinion Correlating to PCT/IB2012/000247 dated Oct. 29, 2012.

* cited by examiner

US 9,099,306 B2

INTEGRATED CIRCUIT DEVICE AND A METHOD FOR PROVIDING ESD PROTECTION

FIELD OF THE INVENTION

This invention relates to an integrated circuit (IC), device and a method of providing electrostatic discharge (ESD) protection, and in particular to a method of providing ESD protection to at least one external contact within an IC device for a high voltage application.

BACKGROUND OF THE INVENTION

In the field of integrated circuit (IC) devices, electrostatic discharge (ESD) is a known problem that can affect the functioning of IC devices, and even cause permanent damage to such devices. Accordingly, ESD protection is an important aspect of the design of IC devices.

A metal oxide semiconductor field effect transistor (MOSFET) has a parasitic bipolar transistor characteristic that may be used to provide ESD protection. For example, an n-channel MOSFET (NMOS) comprises a parasitic NPN bipolar transistor characteristic. If the drain voltage of the NMOS increases beyond its saturation region, many electron-hole pairs are generated by impact ionizations and the NMOS reaches its avalanche region. Electrons that occur due to impact ionizations flow to the drain of the NMOS (e.g. the collector of the parasitic bipolar transistor), with holes flowing to the substrate (e.g. the base of the parasitic bipolar transistor). When a sufficiently large number of holes have collected in the substrate, the parasitic bipolar transistor switches on and the drain current through the NMOS reaches the snapback region. This 'snapback' characteristic within the NMOS transistor is often exploited to provide ESD protection within an IC device. Advantageously, such snapback devices provide a compact solution to ESD protection.

However, such a snapback solution is not suitable for high voltage applications due to the possibility of latch-up of the snapback device occurring, making such a solution unreliable. High voltage applications may be considered to comprise voltage levels higher than 40V. Latch-up is a term used to refer to the inadvertent creation of a low impedance path between the power supply rails of a MOSFET circuit, triggering a parasitic structure which disrupts proper function of the circuit, and requires a power cycle to correct the situation. For example, during normal operation if a pin is biased at 80V, and if an ESD event occurs, then the ESD diode goes into snapback and the voltage across the pin will decrease to 30V. In this case the pin that is biased at 80V if forced to go to 30V and the current from the 80V supply or load is discharge into the ESD diode, causing a latch-up. A latch-up can possibly even lead to the destruction of the MOSFET device due to overcurrent.

Non-snapback devices such as large diode-like structures may alternatively be used for high voltage applications, thereby avoiding the problem of latch-up occurring. However, in order to dissipate the energy required for ESD protection, the size of such non-latch-up devices can be undesirably large. For example, in the case of a diode-like structure, the current capability during an ESD event is directly proportional to the active area of the structure. Typically the current density of such a device is between 50 mA and 100 mA per micrometer of active area length. For an 8 kV HBM (Human Body Model) ESD event, the current peak is 5.33 A. To achieve a high voltage (e.g. >80V) diode, a stack of several stages of medium voltage or low voltage diodes is necessary. For example three stages (60V+15V+15V) of diodes may be stacked in series. However, the greater the number of stages in series, the greater the resistance in series of the whole diode structure. In order to reduce the series resistance, the active area of the stages is required to be increased. Accordingly, a high voltage central diode device is required to be larger than a 'classical' ESD diode because it is formed by a stack of diodes to elevate the voltage capability and the area has to be increased in order to keep the series resistance to a safe value (for example lower than 3 ohm). As such, such non-snapback devices are typically required to be undesirably large in order to be able to dissipate the energy required for ESD protection.

SUMMARY OF THE INVENTION

The present invention provides an integrated circuit device and a method of providing electrostatic discharge, ESD, protection to at least one external contact within an integrated circuit, IC, device for a high voltage application, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 1:
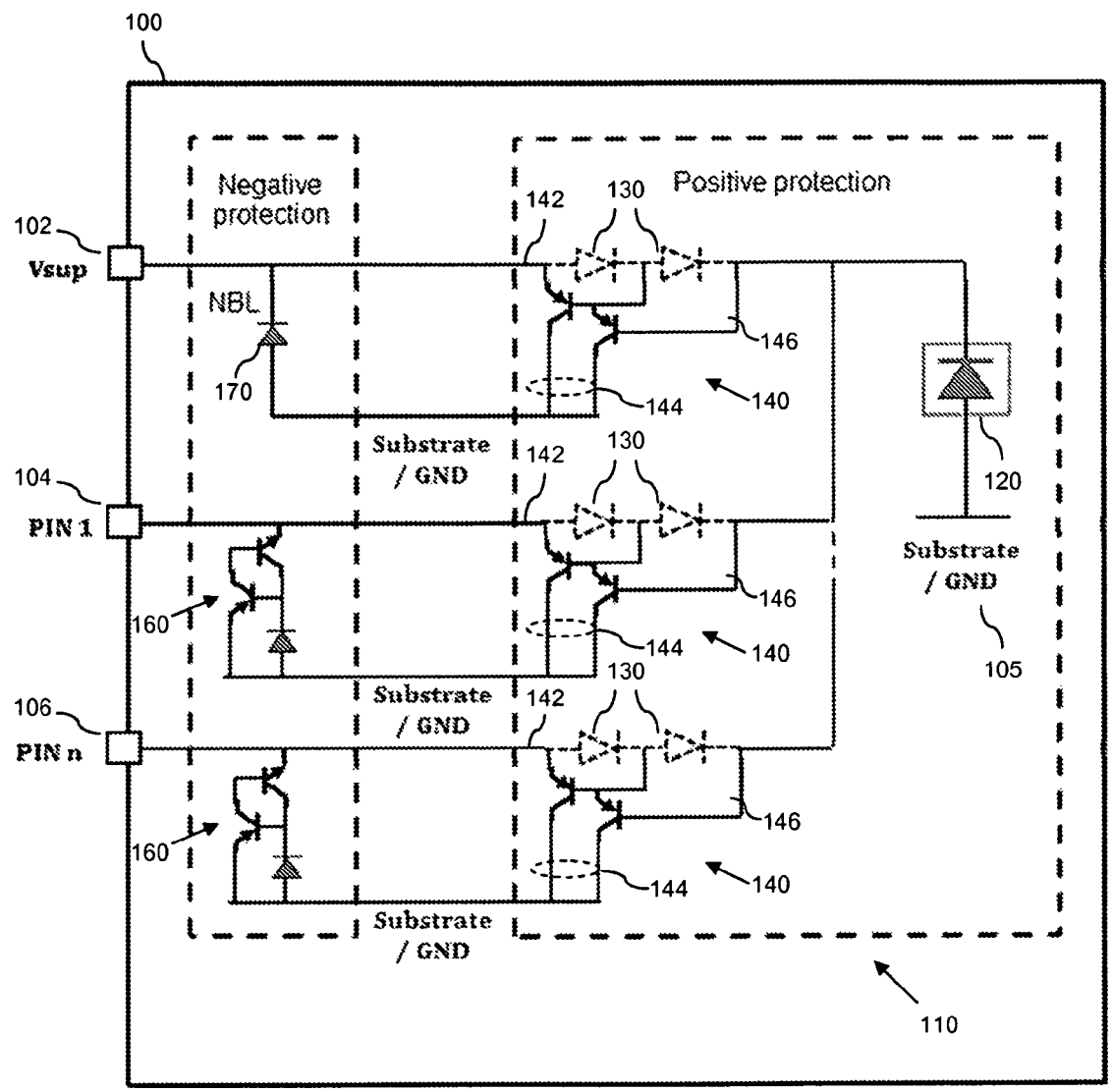
FIG. 1 illustrates a simplified diagram of an example of an integrated circuit device.

Referring first to FIG. 1, there is illustrated a simplified circuit diagram of an example of an integrated circuit device 100 comprising device comprising an electrostatic discharge (ESD) protection network 110 for a high voltage application. For clarity, a high voltage application may comprise an electrical/electronic application comprising voltage levels above, say, 40V. The ESD protection network 110 comprises a common diode structure 120 operably coupled between one or more external contacts 102, 104, 106 of the IC device 100 for which ESD protection is to be provided, and a substrate 105 of the IC device 100, for example a ground plane of the IC device, such that the common diode structure 120 is reverse biased towards the external contacts 102, 104, 106.

The ESD protection network 110 further comprises isolation diode structures 130 operably coupled between each of the external contacts 102, 104, 106 of the IC device 100 for which the ESD protection network 110 is to provide ESD protection, and the common diode structure 120 such that the isolation diode structures 130 are forward biased towards the common diode structure 120. The ESD protection network 110 still further comprises Darlington transistor structures 140 operably coupled between each of the external contacts 102, 104, 106 of the IC device 100 for which the ESD protection network 110 is to provide ESD protection, and the common diode structure 120. Each Darlington transistor structure 140 in the illustrated example comprises: an emitter node 142 operably coupled to the respective external contact 102, 104, 106 of the IC device 100, between the respective external contact 102, 104, 106 and the respective isolation diode structure 130; a collector node 144 operably coupled to the substrate 105 of the IC device 100; and a base node 146 operably coupled between the respective isolation diode structure 130 and the common diode structure 120.

For clarity, a Darlington structure, sometimes called a Darlington pair, is a compound structure consisting of two bipolar transistors. The bipolar transistors may be integrated or separate devices, and are connected in such a manner that the current amplified by the first transistor is amplified further by the second one. This configuration enables a high current gain to be achieved than would be achieved by each transistor taken separately, and in the case of integrated devices can take less space than two individual transistors due to the ability of the devices to share a collector.

Figure 2:
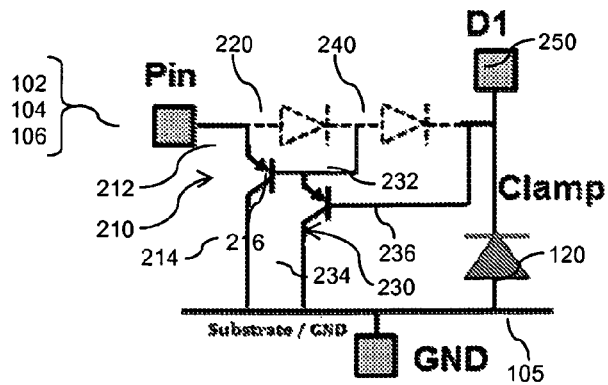
FIG. 2 illustrates a simplified circuit diagram of a part of an electrostatic discharge protection network.

Thus, and referring to FIG. 2, each Darlington transistor structure 140 in the illustrated example comprises:
  a first PNP transistor component 210 comprising an emitter node 212 operably coupled to the respective external contact 102, 104, 106 of the IC device 100, between the respective external contact 102, 104, 106 and a first diode component 220 of respective isolation diode structure 130, a collector node 214 operably coupled to the substrate 105 of the IC device 100, and a base node 216 operably coupled between the first diode component 220 of the respective isolation diode structure 130 and a further diode component 240 of the respective isolation diode structure 130; and
  a further PNP transistor component 230 comprising an emitter node 232 operably coupled to the base node 216 of the first transistor component (and thereby also operably coupled between the first diode component 220 of the respective isolation diode structure 130 and a further diode component 240 of the respective isolation diode structure 130), a collector node 234 operably coupled to the substrate 105 of the IC device 100, and a base node 236 operably coupled between the further diode component 240 of the respective isolation diode structure 130 and the common diode structure 120.

The isolation diode structures 130 in the illustrated example may be integrally formed through the emitter/base PN junction of the respective PNP transistor component 210, 230 of the Darlington transistor structure 140. In this manner, the isolation diode structures 130 may provide high voltage (e.g. ~80V) isolation between the external contacts; for example, each diode component 220, 240 providing ~40V of isolation.

In this manner, when an ESD event occurs at one of the external contacts 102, 104, 106 of the IC device 100, the voltage at that external contact 102, 104, 106 increases. If the voltage at the external contact 102, 104, 106 reaches the avalanche breakdown voltage for the common diode structure 120, current is able to flow through the common diode structure 120 to the substrate 105, and thereby to ground. The resulting current flow causes a voltage drop across the isolation diodes 220, 240, which in turn negatively biases the base-emitter voltages for the respective PNP transistor components 210, 230, thereby activating the Darlington transistor structure 140 to enable current to also flow there through to the substrate 105 and thereby to ground. In this manner, during an ESD event or the like in which the voltage at an external contact 102, 104, 106 exceeds the avalanche breakdown voltage for the common diode structure 120, the respective Darlington transistor structure 140 is activated to enable at least some of the energy to be dissipated there through. As a result, the amount of energy that the common diode structure 120 is required to dissipate is reduced, thereby enabling the size of the common diode structure 120 to be reduced. Furthermore, by enabling at least some of the energy to be dissipated individually for each external contact 102, 104, 106 (i.e. via the respective Darlington transistor structure 140) improves the ESD robustness of the ESD protection network.

Thus, in the illustrated example, the arrangement of the isolation diode structure 130 and respective Darlington transistor structure 140 for each external contact provides the combined functionality of:
  isolating the respective external contact 120, 140, 106 from the other external contacts to which the common diode structure 120 is also operably coupled (by virtue of the isolation diode structure 130); and
  enabling at least a part of the current resulting from an avalanche breakdown occurring within the common diode structure 120 to be diverted there through to ground.

Whilst the Darlington transistor structures in the illustrated example, and described herein, comprise two PNP transistor components 210, 230, in other examples the Darlington transistor structures may comprise any suitable number of PNP transistor components stacked together. Advantageously, the more PNP transistor components within each Darlington transistor structure, the larger the current that may be diverted through the Darlington transistor structure to the substrate 105 during an ESD event. One constraint on the number of transistor components is that the breakdown voltage of NP (base/emitter) junction for the Darlington transistor structure is required to be high enough (e.g. >>80V) to get a good isolation between the external contacts 102, 104, 106 of the IC device 100. A further constraint may be the need to keep the area consumed by the ESD protection network 110 as a whole, including making the Darlington transistor structures 140, sufficiently small.

In some examples, the common diode structure 120 may comprise a plurality of stacked low/medium voltage diode components. For example, in order to achieve a high voltage 80V diode, three stages (60V+15V+15V) of diodes may be stacked in series in order to elevate the voltage capability to the required high voltage level. Furthermore the (or each) diode component may be formed by NPN, PNP, NMOS, and/or PMOS (p-channel MOSFET) diodes, or with a mix of thereof that can provide a transient behaviour with a high snapback voltage (e.g. higher than 80V in the example herein described).

In some examples, one or more of the external contacts for which ESD protection is to be provided by the ESD protection network 110 may comprise a high voltage supply contact, such as external contact 102 in FIG. 1. In this manner, the voltage supply contact 102 enables a DC (direct current) component for the ESD protection network to be substantially fixed. For example, if the external contact 102 comprises an 80V DC voltage supply, the voltage at the external contact 102 is forced to a static 80V. Accordingly, a voltage of approximately 80V (less the voltage drop across the isolation diode structure 130) is induced across the common diode structure 120. The 80V supply voltage may be generated by internal supply (i.e. inside the IC device 100) or supplied by an external supply (not shown).

In this manner, the ESD protection network 110 may be made more robust for electromagnetic compatibility (EMC). For example, EMC stresses relate to electromagnetic interferences from, say, 10 MHz to 1 Ghz applied to an external contact 102, 104, 106 of the IC device 100. The common diode structure 120 is able to drive a small current to the substrate 105 through parasitic elements such as parasitic capacitance. This parasitic capacitance exists in each stage of the common diode structure 120 and also in the PNP devices (e.g. the transistor components 210, 230 of the Darlington transistor structures 140 and the diode components 220, 240 of the isolation diode structures 130). During EMC stresses, a rectification phenomenon can occur due to current going into the substrate 105 through such parasitic elements, which can create a malfunction of the IC device 100.

However, if an external contact comprises voltage supply, such as external contact 102 in the illustrated example, the voltage at the external contact 102 is forced to a static voltage level (e.g. to 80v). Accordingly, the current will flow to the substrate through parasitic element only if the voltage between the external contacts 102, 104, 106 and the substrate 105 is higher than the supply voltage (e.g. 80V). Below this supply voltage level during EMC stresses (AC 10 MHz to 1 GHz) on an external contact 102, 104, 106 of the IC device 100, the emitter-base junction of the respective Darlington transistor structure 140 is not forward biased, and so no current can pass there through.

Figure 3:
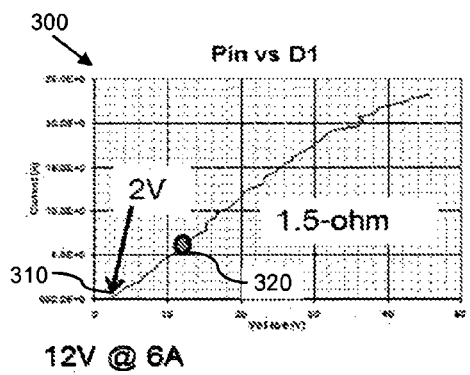
FIGS. 3 to 5 illustrate graphs showing examples of current versus voltage for the electrostatic discharge protection network of FIG. 2.

Referring now to FIG. 3, there is illustrated a graph 300 showing an example of current versus voltage as measured across the isolation diode components 220, 240 in FIG. 2. The voltage across each of the two isolation diode components 220, 240 is 0.3V at low current levels in static biasing conditions. However, during an ESD event, a higher current is injected, and as illustrated at 310 within the graph 300 we see the two isolation diode components 220, 240 begin to drive current at approximately 2V. The sum of the on resistances of the two isolation diode components 220, 240 in series in the illustrated example was measured at 1.5 ohms, between the external contact 102, 104, 106 and D1 250. As illustrated at 320 in FIG. 3, the measured voltage at 6 A across the isolation diode components 220, 240 is 12V.

Figure 4:
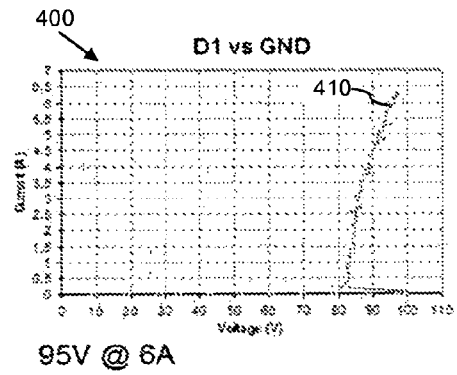

Referring now to FIG. 4, there is illustrated a graph 400 showing an example of current versus voltage as measured across the common diode structure 120, between D1 250 and the substrate 105 in FIG. 2. As illustrated at 410 in FIG. 4, during an ESD event, when the common diode structure 120 is within its avalanche breakdown region, the measured voltage at 6 A across the common diode structure 120 is 95V.

Figure 5:
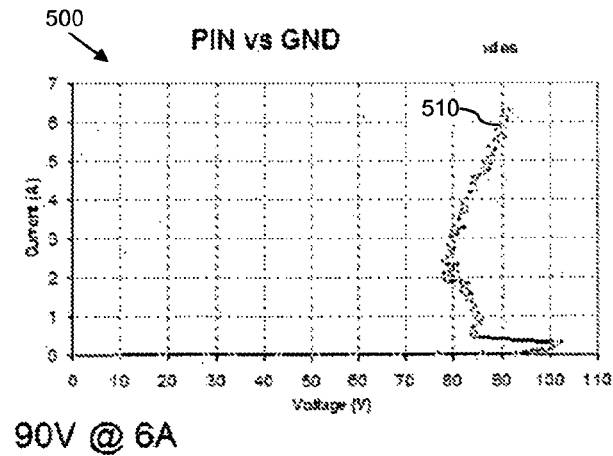

Referring now to FIG. 5, there is illustrated a graph 500 showing an example of current versus voltage as measured across the ESD protection network 110, including the isolation diode components 220, 240 in series and the common diode structure 120, between the external contact 102, 104, 106 and the substrate 105 in FIG. 2. As illustrated at 510 in FIG. 5, during an ESD event, when the common diode structure 120 is within its avalanche breakdown region, the measured voltage at 6 A across the ESD protection network 110 is 90V. Significantly, the voltage across the ESD protection network 110 (90V) is less than the sum of the voltages across the isolation diode components 220, 240 and the common diode structure 120 (12V+95V=107V).

This may be explained because the Darlington transistor structure 140 diverts a large part of the current into the substrate 105; this current flowing through the emitter 142 to the collector 144 and into the substrate 105 (FIG. 1). Significantly, as current flows through the emitter 142 of the Darlington transistor structure 140 to the base 146 of the Darlington transistor structure 140, and to the common diode structure 120, the emitter/base junction of the Darlington transistor structure 140 is forward biased, and the emitter 142 is at a voltage level of, in the illustrated example, 80V, whilst the collector 144 of the Darlington transistor structure 140 is held at 0V by the substrate 105. The current going to the common diode structure 120 through the emitter/base junction of the Darlington transistor structure (i.e. through the isolation diode structure 130) is amplified (Beta×Beta for the Darlington PNP structure) and directly diverted to the substrate 105. Because the Darlington transistor structure 140 drives current directly to the substrate 105 when the common diode structure 120 is triggered (i.e. when the common diode structure 120 enters its avalanche breakdown region), it explains why the global solution of the Darlington transistor structure 140 and the common diode structure 120 is very efficient. Moreover, the Darlington transistor structure 140 and the common diode structure 120 of the illustrated example enables medium voltage devices to be used to provide a high voltage solution with a high voltage isolation between each external contact 120, 104, 106.

In the example illustrated in FIG. 1, the Darlington transistor structures 140, isolation diode structures 130 and the common diode structure 120 provide positive ESD protection. For such positive polarity ESD protection, snapback within the ESD protection components is not wanted due to the possibility of the snapback components going into a latch-up condition. However, such a condition is typically not relevant for negative polarity ESD protection because in normal conditions the integrated circuit device 100 is not biased in negative polarity; in normal operations the external contacts 102, 104, 106 would be positively biased.

Accordingly, since snapback is permitted for negative polarity ESD protection, the ESD protection network 110 illustrated in FIG. 1 further comprises silicon-controlled rectifier structures 160 operably coupled between external contacts 104, 106 and the substrate 105 of the IC device 100, the silicon-controlled rectifier structures 160 being arranged to provide negative ESD protection to the respective external contacts 104, 106.

A power supply is able to deliver a high current level with no limitation. Accordingly, if a silicon-controlled rectifier were implemented for negative polarity ESD protection on the voltage supply contact 102, when the silicon-controlled rectifier turned on, the silicon-controlled rectifier would snapback to a lower value than the supply voltage, with the current of the voltage supply being absorbed by silicon-controlled rectifier. As a result, latch-up would occur, with the current of power supply keeping the silicon-controlled rectifier in an on state. Thus, in the illustrated example, negative polarity ESD protection for the voltage supply contact 102 is provided by way of an N Buried Layer (NBL) diode 170 operably coupled between the voltage supply contact 102 and the substrate 105 of the IC device 100.

Figure 6:
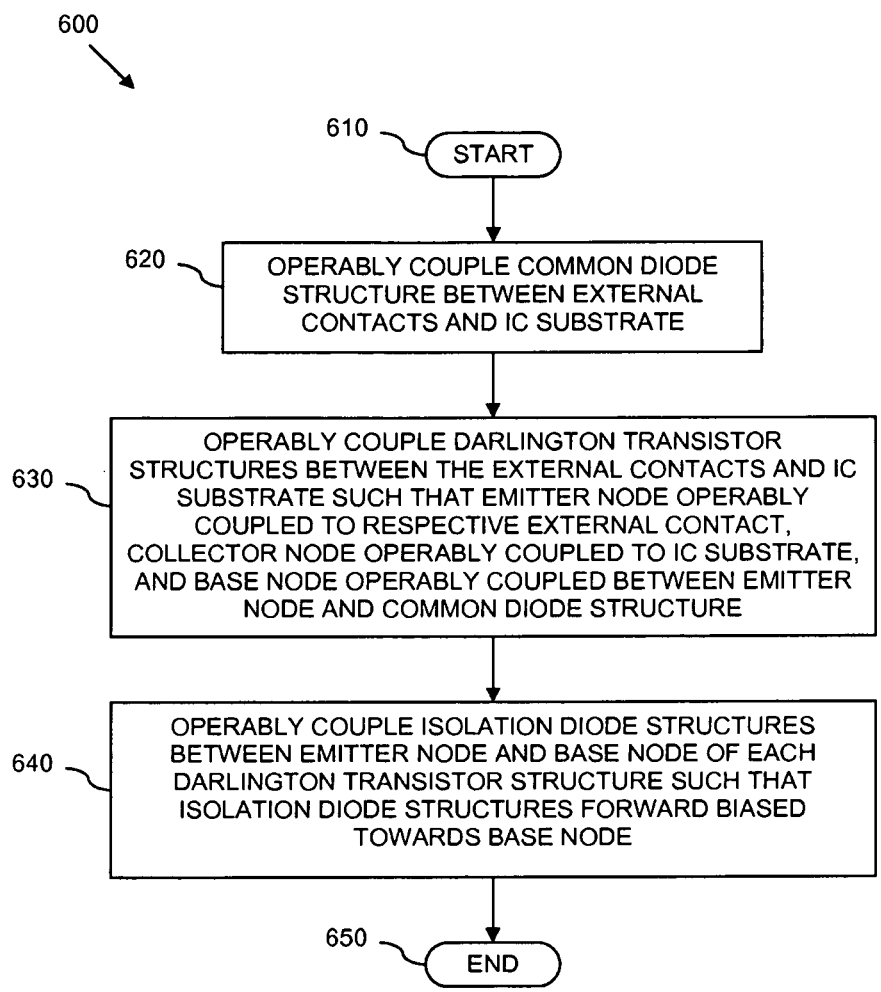
FIG. 6 illustrates a simplified flowchart of an example of a method of providing electrostatic discharge protection.

Referring now to FIG. 6, there is illustrated a simplified flowchart 600 of an example of a method of providing ESD protection to external contacts within an IC device for a high voltage application. The method starts at 610, and moves on to 620 where a common diode structure is operably coupled between the external contacts of the IC device for which ESD protection is to be provided and a substrate of the IC device, such that the common diode structure is forward biased towards the external contacts. Next, at 630, Darlington transistor structures are operably coupled between the external contacts of the IC device for which ESD protection is to be provided and the substrate of the IC device. Each of the Darlington transistor structures is arranged such that said structure comprises an emitter node operably coupled to the at least one external contact of the IC device, a collector node operably coupled to the substrate of the IC device, and a base node operably coupled between the emitter node of the Darlington transistor structure and the common diode structure. Isolation diode structures are then operably coupled between the emitter node and the base node of each of the Darlington transistor structures, at 640, such that the isolation diode structures are forward biased towards the respective base nodes. The method then ends, at 650.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

Although specific conductivity types or polarity of potentials have been described in the examples, it will be appreciated that conductivity types and polarities of potentials may be reversed.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit (IC) device comprising at least one electrostatic discharge (ESD) protection network for a high voltage application, the at least one ESD protection network comprising:
    a common diode structure operably coupled between at least one external contact of the IC device for which ESD protection is to be provided and a substrate of the IC device such that the common diode structure is forward biased towards the at least one external contact;
    at least one Darlington transistor structure operably coupled between the at least one external contact of the IC device for which ESD protection is to be provided and the substrate of the IC device, the at least one Darlington transistor structure comprising:
        an emitter node operably coupled to the at least one external contact of the IC device;
        a collector node operably coupled to the substrate of the IC device; and
        a base node operably coupled between the emitter node of the Darlington transistor structure and the common diode structure; and
    at least one isolation diode structure operably coupled between the emitter node and the base node of the at least one Darlington transistor structure such that the at least one isolation diode structure is forward biased towards the base node.

2. The IC device of claim 1 wherein the at least one Darlington transistor structure comprises:
    a first transistor component comprising an emitter node operably coupled to the at least one external contact of the IC device, between the at least one external contact of the IC device and a first diode component of the at least one isolation diode structure, a collector node operably coupled to the substrate of the IC device, and a base node operably coupled between the first diode component of the at least one isolation diode structure and at least one further diode component of the at least one isolation diode structure; and
    at least one further transistor component comprising an emitter node operably coupled to the base node of the first transistor component, a collector node operably coupled to the substrate of the IC device, and a base node operably coupled between the at least one further diode component of the at least one isolation diode structure and the common diode structure.

3. The IC device of claim 2 wherein the at least one isolation diode structure is integrally formed through an emitter/base PN junction of the first and at least one further transistor components of the respective Darlington transistor structure.

4. The IC device of claim 1 wherein the at least one ESD protection network further comprises at least one silicon-controlled rectifier structure operably coupled between the at least one external contact and the substrate of the IC device; the at least one silicon-controlled rectifier structure arranged to provide negative ESD protection to the at least one external contact.

5. The IC device of claim 1 wherein the at least one ESD protection network comprises:
    a common diode structure operably coupled between a plurality of external contacts of the IC device for which ESD protection is to be provided and a substrate of the IC device such that the common diode structure is forward biased towards the at least one external contact;
    at least one Darlington transistor structure operably coupled between each external contact of the IC device for which ESD protection is to be provided and the substrate of the IC device, the at least one Darlington transistor structure comprising:
  an emitter node operably coupled to the respective external contact of the IC device;
  a collector node operably coupled to the substrate of the IC device; and
  a base node operably coupled between the emitter node of the Darlington transistor structure and the common diode structure; and
at least one isolation diode structure operably coupled between the emitter node and the base node of the at least one Darlington transistor structure operably coupled to each external contact for which ESD protection is to be provided, such that the at least one isolation diode structure is forward biased towards the base node.

6. The IC device of claim 5 wherein at least one of the external contacts of the IC device comprises a high voltage supply contact.

7. The IC device of claim 6 wherein the at least one ESD protection network further comprises at least one N Buried Layer diode structure operably coupled between the voltage supply contact and the substrate of the IC device; the at least one N Buried Layer diode structure arranged to provide negative ESD protection to the voltage supply contact.

8. The IC device of claim 1 wherein the common diode structure comprises a plurality of stacked low/medium voltage diode components.

9. A method of providing electrostatic discharge, ESD, protection to at least one external contact within an integrated circuit, IC, device for a high voltage application, the method comprising:
  operably coupling a common diode structure between the at least one external contact of the IC device and a substrate of the IC device such that the common diode structure is forward biased towards the at least one external contact;
  operably coupling at least one Darlington transistor structure between the at least one external contact of the IC device and the substrate of the IC device, such that the at least one Darlington transistor structure comprises:
    an emitter node operably coupled to the at least one external contact of the IC device;
    a collector node operably coupled to the substrate of the IC device; and
    a base node operably coupled between the emitter node of the Darlington transistor structure and the common diode structure; and
  operably coupling at least one isolation diode structure between the emitter node and the base node of the at least one Darlington transistor structure such that the at least one isolation diode structure is forward biased towards the base node.

* * * * *